United States Patent [19]

Crowley

[11] 4,349,887
[45] Sep. 14, 1982

[54] PRECISE DIGITALLY PROGRAMMED FREQUENCY SOURCE

[75] Inventor: Albert T. Crowley, Somerdale, N.J.

[73] Assignee: RCA Corporation, New York, N.Y.

[21] Appl. No.: 181,086

[22] Filed: Aug. 22, 1980

[51] Int. Cl.³ .......................................... H03B 19/00
[52] U.S. Cl. .................... 364/703; 364/721; 328/14
[58] Field of Search ................. 364/703, 721; 328/14

[56] References Cited

U.S. PATENT DOCUMENTS

| | | | |
|---|---|---|---|
| 3,787,836 | 1/1974 | Hagelbarger | 340/347 DA |
| 3,898,579 | 8/1975 | Aldridge | 331/1 A |
| 3,952,289 | 4/1976 | Baligant | 364/200 |
| 3,973,209 | 8/1976 | Nossen et al. | 328/14 |
| 3,976,945 | 8/1976 | Cox | 328/14 |
| 4,021,757 | 5/1977 | Nossen | 332/19 |
| 4,047,009 | 9/1977 | Challen | 364/721 |
| 4,068,178 | 1/1978 | Tunzi | 328/14 |
| 4,134,072 | 1/1979 | Bolger | 328/14 |
| 4,144,579 | 3/1979 | Nossen et al. | 364/607 |
| 4,234,929 | 11/1980 | Riley, Jr. | 364/703 X |
| 4,240,034 | 12/1980 | Lowenschuss | 328/14 |
| 4,241,408 | 12/1980 | Gross | 364/703 |

Primary Examiner—David H. Malzahn
Attorney, Agent, or Firm—Samuel Cohen; Joseph S. Tripoli; Donald W. Phillion

[57] ABSTRACT

A digitally controlled oscillator for generating a plurality of signals spaced apart by very small frequency increments. The system comprises first means for generating a source signal of frequency $f_c$, second means responsive to said first signal to produce a first binary output signal of frequency $Nf_c/2^n$, where n is a variable integer. Also provided are first frequency divider means responsive to said first binary output signal to produce a second binary output signal of frequency $Nf_c/2^{n+m}$, where m is another integer and second frequency divider means also responsive to said first signal $f_c$ to produce a third binary output signal of frequency $f_c/2^T$. Further provided are logic means responsive to said second and third binary output signals to produce a fourth binary output signal of average frequency $f_c/2^T + Nf_c/2^{n+m}$.

10 Claims, 8 Drawing Figures

| COLUMN | | | |
|---|---|---|---|
| I | II | III | IV |
| LSB | | MSB | DECIMAL VALUE |
| $e_{124}$ | $e_{125}$ | $e_{126}$ | |
| 0 | 0 | 0 | 0 |
| 0 | 1 | 0 | 2 |
| 0 | 0 | 1 | 4 |
| 0 | 1 | 1 | 6 |
| 1 | 1 | 1 | 7 |
| 1 | 1 | 0 | 5 |
| 1 | 0 | 0 | 3 |
| 1 | 0 | 0 | 1 |

Fig. 5

| COLUMN | | | |
|---|---|---|---|
| I | II | III | IV |
| LSB | | MSB | DECIMAL VALUE |
| $e_{288}$ | $e_{287}$ | $e_{286}$ | |
| 1 | 0 | 0 | 1 |
| 1 | 1 | 0 | 3 |
| 1 | 0 | 1 | 5 |
| 1 | 1 | 1 | 7 |
| 0 | 1 | 1 | 6 |
| 0 | 0 | 1 | 4 |
| 0 | 1 | 0 | 2 |
| 0 | 0 | 0 | 0 |

PRECISE DIGITALLY PROGRAMMED FREQUENCY SOURCE

The U.S. Government has rights in this invention under Contract No. u/F33562-78-C-0177, awarded by the Department of the Air Force.

This invention relates generally to digitally controlled oscillators and more particularly to a digitally controlled oscillator capable of generating a plurality of signals spaced apart by very small frequency increments.

In many applications it is necessary to generate an output signal whose frequency can be varied in very small, but very precise steps, over a relatively narrow frequency band. For example, in some distance ranging systems, it is necessary to generate frequencies from 63,997 Hz to 64,003 Hz in 0.001 Hz steps. Other applications requiring small and precise frequency steps are tone generators, test equipment, code tracking loops, bit timing extractors, and others. A prior art means for generating such a spectrum of closely stepped frequencies employs an arithmetic frequency synthesizer. An arithmetic frequency synthesizer consists basically of a digital accumulator followed by a digital-to-analog (D/A) converter. The accumulator receives an incremental binary value which is a digital number that represents a phase increment, and adds such increment to the previous binary number totalled in the accumulator upon each occurrence of a clock pulse supplied from a suitable clock pulse source. The resultant output from the accumulator is a series of digital words whose magnitudes represent the phase of the output signal at any given time. The frequency of the output signal from the accumulator is determined by the overflow rate of the accumulator. More specifically, each time the accumulator accumulates its capacity it will overflow and return to a near zero value at which time the accumulation of the incremental binary values will begin anew. To generate the above described spectrum of frequencies with an input frequency $f_c$ of 1.024 MHz requires an accumulator having thirty stages, of which only the eight or ten most significant bits are employed to drive the D/A converter. The output of the D/A converter is a stepped analog signal which can be filtered to remove the quantizing noise.

Certain disadvantages are attendant with the use of an arithmetic frequency synthesizer (AFS) to generate the spectrum of the frequencies as discussed above. In an AFS all stages of the accumulator are clocked at the clock rate. In most types of circuits the amount of power required is proportional to the clock rate and the number of circuits being clocked. Thus, doubling the clocking rate of a circuit requires approximately twice as much power. Further, the cost of a thirty bit accumulator is relatively large.

The present invention provides a structure for generating the spectrum of frequencies discussed above whose cost and power requirements are less than those of the prior art structure described above since the clocking rate for much of the logic of the present invention is less.

In accordance with a preferred embodiment of the invention, there is provided a system for selectively generating any one of M signals frequency spaced apart by S Hz where S is a fixed value and comprising first means for generating a first signal of frequency $f_C$, a second means responsive to said first signal to produce a binary output signal of frequency $Nf_c/2^n$, where N is a variable integer $<2^n$ and n is an integer, and first frequency divider means responsive to said first output signal to produce a second binary output signal of frequency $Nf_c/2^{n+m}$, where $f_c/2^{n+m}=S$ and m is an integer. Also provided are second frequency divider means responsive to said first signal to produce a third binary output signal of frequency $f_c/2T$ where 2T is an integer $<n+m$, and logic means responsive to said second and third binary output signals to produce a fourth output signal of frequency $f_c/2T + Nf_c/2^{n+m}$.

Figure 1:
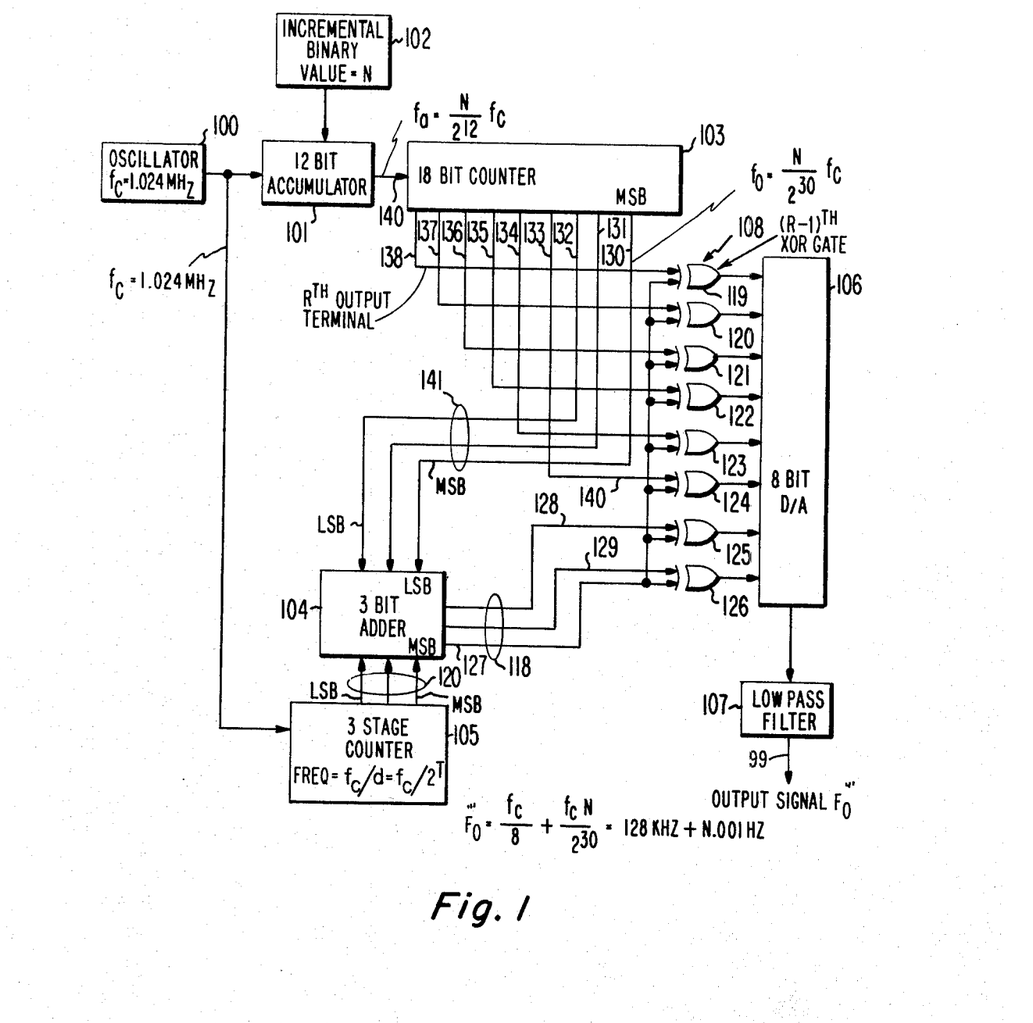
FIG. 1 shows a block diagram of one form of the invention.
Figure 2:
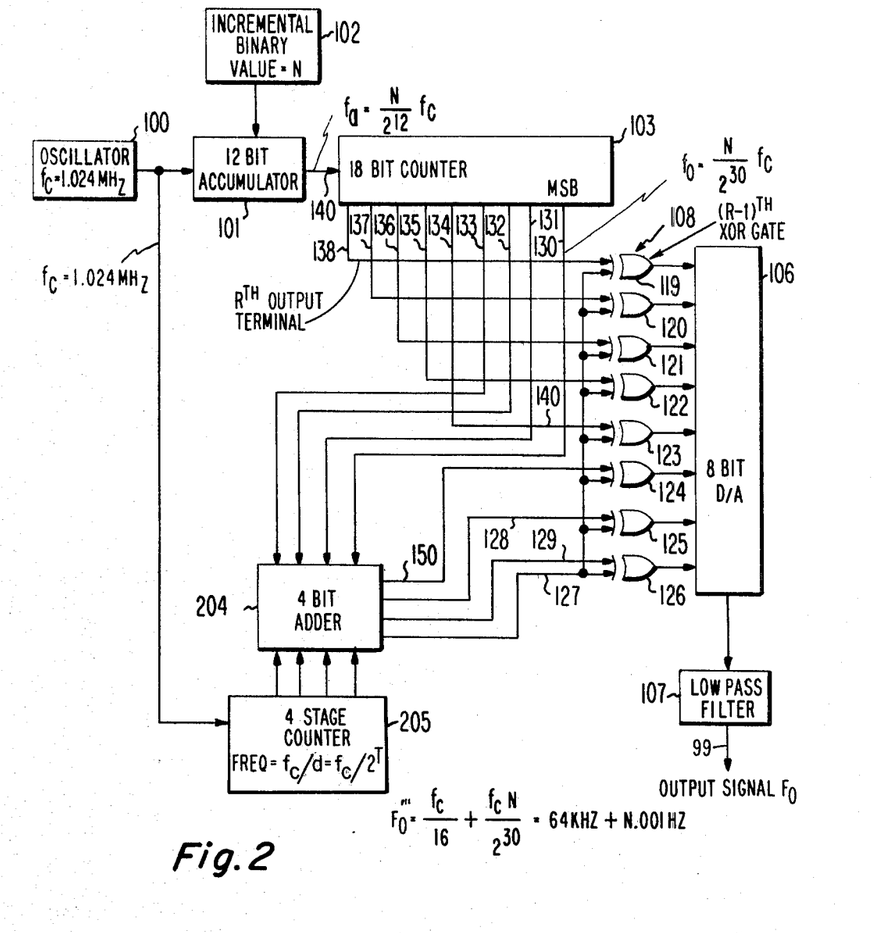
FIG. 2 shows a block diagram of another form of the invention.

The diagrams of FIGS. 1 and 2 are quite similar except that FIG. 1 employs a three stage counter 105 and a three bit adder 104, whereas the corresponding elements of FIG. 2, namely counter 205 and adder 204, each have four stages. The significance of such difference is as follows. The structure of FIG. 1 will produce from a 1.024 MHz source 100 a spectrum of frequencies separated by 0.001 Hz with a nominal base frequency of 128 KHz, whereas the structure of FIG. 2 will produce a spectrum of frequencies separated by 0.001 Hz with a nominal base frequency of 64 KHz. Such difference results from the three stage counter 105 of FIG. 1 dividing the $f_c=1.024$ MHz output of oscillator 100 by 8 to produce a 128 KHz signal whereas in FIG. 2 the 1.024 MHz output signal from oscillator 100 is divided by 16 in the four stage counter 205a to produce a 64 KHz signal.

The description of the invention and its operation can be better described in connection with the simpler structure of FIG. 1 rather than the more complex structure of FIG. 2. The following description of FIG. 1 and the expressions employed in connection with such description can readily be applied to the structure of FIG. 2.

An oscillator 100 provides a basic frequency signal source, arbitrarily selected to be 1.024 MHz, which is supplied to the 12-bit accumulator 101 and also to the 3-stage counter 105. The counter 105 will respond to such 1.024 MHz signal to output a series of 3-bit digitized words on output leads 120 thereof. Since counter 105 is a 3-stage counter with a count capacity of 8, such series of 3-bit words will represent a 128 KHz (1.024/8) on the output leads 120.

In the absence of any output being supplied from 18-bit counter 103 to adder 104, the output of the 3-stage counter 105 will pass through adder 104 to the three output leads 118 and then through Exclusive OR (XOR) gates 125 and 126 to the 8-bit D/A converter 106 in a manner to be described in more detail later.

For the present, it should be noted that only two Exclusive OR gates 125 and 126 are employed to receive the three output leads 118 of adder 104. The overall purpose of such an arrangement is to output digital signals from adder 104 representing a stepped triangular waveform (FIGS. 4 and 6) rather than a sawtooth waveform. The triangular waveform is considerably easier to filter into a sine wave or a square wave than is a sawtooth waveform.

The generation of digital signals representing a triangularly shaped waveform rather than a sawtooth shaped waveform is effected generally by supplying the contents of the most significant bit position of adder 104, which appears on output lead 127 thereof, to one input of each of Exclusive OR (XOR) gates 125 and 126. The contents of the least significant bit position of adder 104 is supplied via lead 128 to the other input of XOR gate 125 and the contents of the next to least significant bit position, which appears on lead 129, is supplied to the second input of XOR gate 126. By virtue of the foregoing connections, the generation of the stepped triangularly shaped waveform occurs as described generally immediately below and in detail later herein, re FIGS. 4–7.

During the first four counts of a full 8-count cycle of 3-stage counter 105 which is supplied through adder 104 to the three output leads 118 thereof, the most significant bit of adder 104 appearing on lead 127 will be a 0 and during the second four counts of the full 8-count cycle of counter 105 the most significant bit appearing on lead 127 will be a binary 1. This will cause the signals appearing on the output terminals of XOR gates 125 and 126 to increment positively during said four counts of each complete cycle of counter 105 and to decrement during the second four counts of a complete cycle of counter 105.

The accumulator 101 and the 18-bit counter 103 (an 18-stage counter) in effect form a single counter with 30 stages. The accumulator 101 is, however, different from a conventional counter in that it can receive more than one count for each clock pulse from oscillator 100. More specifically, the incremental binary value stored in source 102 can be anything from a binary 0 to $2^{12}-1$. If it contains a binary 1 then the accumulator 101 functions like a conventional counter in that a 1 is accumulated therein from source 102 for each clock pulse from oscillator 100. On the other hand, if the incremental binary value in source 102 is greater than 1 then the accumulator 101 will increase its total contents by such value for each clock pulse from oscillator 100.

Each time accumulator 101 overflows as a result of the incremental binary value being iteratively supplied thereto, a carry output will be supplied to 18-bit counter 103. It is evident that if the value of the incremental binary value is a 1 that the most significant bit position output appearing on output lead 130 will become a square wave whose frequency is $f_c$ divided by $2^{30}$, thus in effect dividing the 1.024 MHz signal from oscillator 100 by $2^{30}$ which produces a signal of 0.001 Hz.

The output of counter 103 is a digitally encoded representation of the phase of counter 103 and thus, in effect, divides one cycle of counter 103 into $360/2^{18}$ phase increments. Hence, each pulse supplied from accumulator 101 advances the phase of the signal represented by the contents of counter 103 by $360/2^{18}$ degrees.

Similarly, counter 105 divides one cycle of its 128 KHz output signal into $2^3$ or eight phase increments. It will be shown that the output of counters 103 and 105 can be added together employing adder 104 and XOR gates 119 through 126 to generate a signal that is the sum of the instantaneous phase represented by each counter. Since frequency is in fact the rate-of-change of phase, the new signal is also equal to the sum of the frequencies represented by counters 103 and 105. For example, counter 105 has eight states and an input frequency of 1.024 MHz. Hence, it represents $1.024 \times 10^6/8$ or 128 KHz. Similarly, counter 103 divides the input signal online 140 by $2^{18}$. Therefore, if an incremental binary value 1 is entered into the accumulator, the frequency on line 140 will be $N/2^{12} \times 1.024$ MHz which is 250 Hz. Counter 103 divides this by $2^{18}$ which results in a signal of approximately 0.001 Hz. The resultant sum of the signal represented by counters 103 and 105 is therefore 128,000.001 Hz and appears on output lead 99. If a binary 2 is entered into the accumulator the output frequency will be 128,000.002 Hz.

From the foregoing it is apparent that if the incremental binary value from source 102 is 3 then the frequency of the output signal from counter 105 will be changed by 0.003 Hz.

It should be noted that the clock frequency of oscillator 100 and the number of stages of counter 105 are determined by the nominal center frequency desired. In the circuit of FIG. 1 it is assumed that the desired nominal center frequency is 128 KHz which is obtained by a clock of 1.024 MHz and 3-stage counter 105. The number of stages in accumulator 101 determines the number of different frequencies that can be generated. The sum of the number of stages in accumulator 101 and counter 103 determines the maximum frequency deviation.

Ideally, there should be 17 XOR gates and all 18 bits of counter 103 should be utilized. While this would provide very fine quantization, it would require the use of a 17 bit D/A converter which is expensive. However, in many applications, carrier phase quantization steps can be tolerated. Hence, is most cases an 8 or 10 bit D/A converter will provide satisfactory results.

Summarizing the above, the first change in phase seen by D/A converter 106 occurs as follows. After an incremental binary value $N=1$ has been stepped completely through the 12-bit accumulator 101 by $2^{12}$ clock pulses from oscillator 100, a carry out will occur therefrom on lead 140 and be supplied to the input of 18-bit counter 103. Since the contents of only the 9 most significant bit positions of 18-bit counter 103 are ultimately supplied to D/A converter 106, either directly or through adder 104, it follows that there are nine stages of 18-bit counter 103 whose contents are not supplied in any manner to D/A converter 106. Thus $2^9$ overflows of accumulator 101 are required before a binary 1 will appear on the output lead 138 of the ninth most significant bit of counter 103.

Such a binary 1 is supplied via output lead 138 to one input of XOR gate 119 whose output, in turn, is supplied to the least significant bit position of D/A converter 106 and represents only a very small phase change of the output of the 8-bit D/A converter 106. After a another $2^9$ overflows of the accumlator 101 a second binary 1 will be supplied to the 18-bit counter 103 to produce a 0 on output lead 138 and a 1 on the output lead 137 which is connected to the next higher bit position of counter 103. The binary 1 on output lead 137 is supplied to an input of XOR gate 120 whose output, in turn, is supplied to the next least significant bit position of D/A converter 106 to change the phase of the output thereof by an amount twice that resulting from the binary 1 supplied from the output of XOR gate 119.

The foregoing increase in phase of the output of D/A converter 106 (and counter 103) will continue until $2^{18}$ overflows of accumulator 101 have occurred, at which time counter 103 will have completed one cycle. For N=1, this will occur once for every $2^{30}$ clock pulses from oscillator 100.

The resultant change in output frequency in lead 130 of counter 103 represents a division of the oscillator frequency to approximately 0.001 Hz.

It is apparent that if the incremental binary value N is made equal to 2 that a binary 1 will appear on the output 130 of the most significant bit position of counter 103 at twice the rate as when N=1. Accordingly, the incremental frequency of the signal appearing on output lead 130 is 0.002 Hz which, when added to the 128 KHz output of 3-stage adder 104 produces an output signal on output terminal 99 of 128,000.002 Hz.

Consider now a mathematical treatment of the operation of the circuit of FIG. 1. The output $f_a$ of the accumulator 101 can be expressed as follows:

$$f_a = \frac{N}{2^n} f_c \quad (1)$$

where $f_c$ is the output frequency of oscillator 100,

N is the incremental binary value from source 102, and n is the number of stages in accumulator 101.

The minimum frequency spacing $\delta f_a$ between frequencies is $$\delta f_a = f_c/2^n \quad (2)$$

The frequency $f_o$ generated on output lead 130 of the most significant bit position of counter 103 is given by the following expression.

$$f_0 = \frac{N}{2^{n+m}} f_c \quad (3)$$

where m is the number of stages in counter 103.

With the addition of the 18-bit counter 103, the minimum frequency spacing $\delta f_o$ appearing on the output lead 130 of the most significant bit position of counter 103 is given by the following expression, where N=1;

$$\delta f_0 = \frac{f_c}{2^{n+m}} \quad (4)$$

The frequency $f_{105}$ of the signal supplied from 3-stage counter 105 to its three output terminals 120 is:

$$f_{105} = f_c/d = f_c/2^3, \text{ where } d=2^T \text{ and } T=3 \quad (5)$$

The frequencies of the output signals from 18-bit counter 103 and from 3-stage counter 105 are added together in adder 104 and XOR gates 119 through 126 and the resultant digitized signals are supplied to D/A converter 106.

The frequency $F_0$ of the output from converter 106 is given by the following expression:

$$F_0 = f_c/2^3 + \frac{N}{2^{30}} f_c \quad (6)$$

The frequency granularity is given by Expression 4. Thus if the clock frequency of oscillator 100 is 1.024 MHz the output frequency is:

$$F_0 = \frac{1.024 \times 10^6}{2^3} + N(.00095) \quad (7)$$

It can be seen that in the structure of FIG. 1 the 30-bit arithmetic synthesizer accumulator of the prior art has been replaced by one 12-bit accumulator, an adder 104 and two counters 105 and 103.

Figure 4:
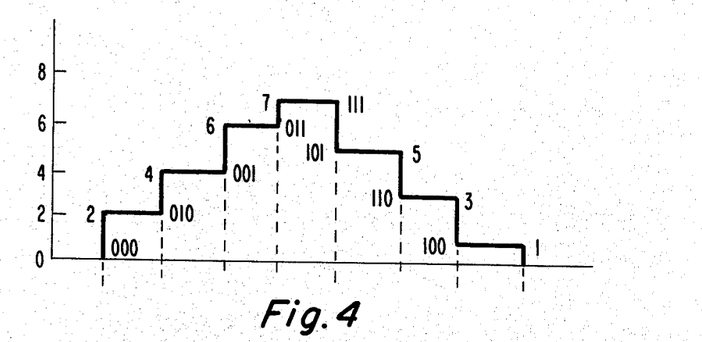
FIGS. 4 and 6 show the analog signals produced from the digital words of the truth tables of FIGS. 3 and 5.
Figure 6:
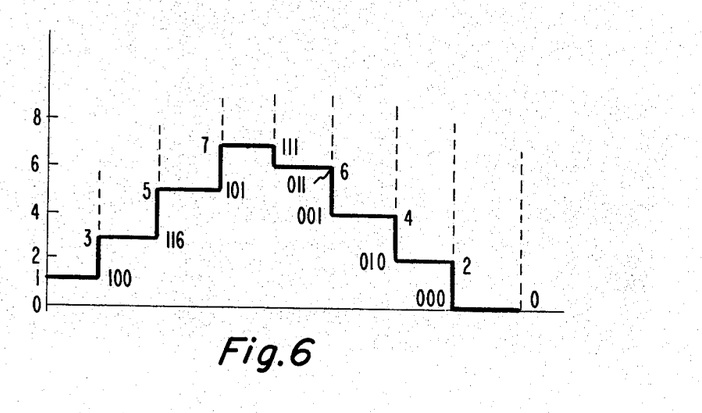

Consider now in detail the function and operation of the XOR gates 119 through 126 collectively identified by reference character 108 and specifically how they produce the triangularly stepped waveforms of FIGS. 4 and 6. Only the functions of XOR gates 124, 125 and 126 will be discussed since they illustrate quite clearly the principles of operation of all of the XOR gates 108.

It is a charactertistic of an XOR gate that if the signal logic levels supplied to the two inputs thereof are the same, the output will be a binary 0 and if the logic levels supplied to the two inputs thereof are unequal, then the output thereof will be a binary 1.

It will be observed that the contents of the most significant bit of adder 104 appearing on lead 127 is supplied to one input of each of the three XOR gates 124, 125 and 126. Therefore, if the contents of said most significant bit of adder 104 is a binary 0 then the logic level supplied to the other input of XOR gates 124-126 will pass therethrough uninverted. For example, if a binary 0 is present on input lead 127 of XOR gate 126, a binary 0 supplied to the other input lead 129 thereof will pass through XOR gate 126 as a binary 0 since the logic level on both input terminals leads 129 and 127 are the same. Further, if a binary 1 is supplied to input lead 129 of XOR gate 126, a binary 1 will appear on the output terminal of said XOR gate 126 since the logic levels on the two input leads thereof are unequal.

On the other hand, if a binary 1 is present on lead 127 then a binary 0 supplied to lead 129 will be inverted to a binary 1 on the output of XOR gate 126 since the logic levels on the two input terminals leads 127 and 129 are unequal. If a binary 1 is supplied to lead 129 the output of XOR gate 126 will be a 0 since the logic levels on the two input leads 127 and 129 thereof are equal.

Figure 3:
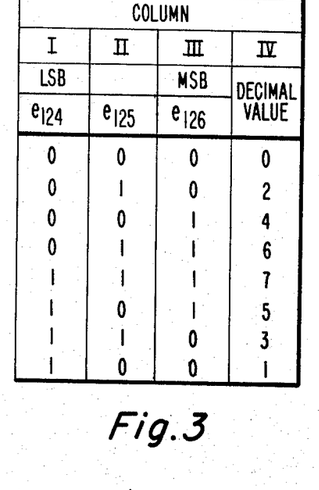
FIGS. 3 and 5 are truth tables showing how the frequency is altered in terms of the digital words supplied to the D/A converter as phase changing bits are continuously added to the adder.
Figure 5:
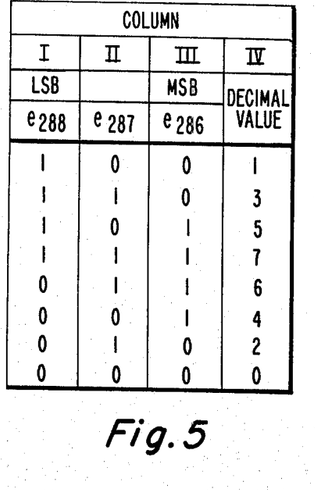

Reference is made to the charts of FIGS. 3 and 5 and the waveforms of FIGS. 4 and 6. FIGS. 3 and 5 are, respectively, a pair of truth tables showing the total binary value outputs of XOR gates 124, 125 and 126 when a binary 0 is supplied to input 140 of XOR gate 124 from 18-bit counter 103 and also when a binary 1 is supplied to input 140 from counter 103.

Consider first the truth table of FIG. 3 which contains 4 columns identified as Columns I-IV. Column I shows the output of XOR gate 124 which is the least significant bit of the 3 XOR gates being considered. The most significant bit is the output from XOR gate 126 shown in Column III and the second most significant bit position is the output from XOR gate 125 shown in column II.

It is to be understood, as discussed above, that the most significant bit from counter 103, not to be confused with the most significant bit in Column III of the truth table of FIG. 3, is connected to one input of each of the 3 XOR gates 124, 125 and 126. The outputs of said 3 XOR gates 124-126 are designated as $e_{124}$, $e_{125}$ and $e_{126}$ in the truth table of FIG. 3.

In FIG. 3 it is assumed that a binary 0 is supplied from counter 103 to one input of XOR gate 124 via lead 133 and that such binary 0 does not change during the present discussion of operation of XOR gates 124–126. Therefore, the output of XOR gate 124 will follow the level of the most significant bit position of adder 104 which is supplied to the other input of XOR gate 124. Such most significant bit is a binary 0 during the first 4 counts of the 8-count cycle of counter 105 and then will change to a binary 1, as shown in the truth table of FIG. 3, during the remaining 4 counts of the 8-count cycle of counter 105.

During the time that the contents of the most significant bit position of adder 104 is a binary 0 the output of XOR gate 124 will be a binary 0, as shown in Column I of FIG. 3. During the last four counts of each 8-count cycle of adder the output of XOR gate 124 will be a binary 1. By similar analysis the states of each of the outputs of XOR gates 125 and 126 can be determined to be as shown in the truth table of FIG. 3. In Column IV of FIG. 3 there is shown the decimal value of the collective outputs of the 3 XOR gates 124–126. Such decimal values can be seen to rise in increments of 2 to a value of 6, then rise one increment to a value of 7, and then descend in increments of 2, to 5, to 3, and then to 1.

The analog value of the binary output of the 3 XOR gates 124–126 is shown in the waveform of FIG. 4 and can be seen to be a stepped triangularly shaped waveform which repeats itself iteratively as long as the system is operating and as long as there is no output from lead 133 of counter 103.

If a binary 1 occurs on output lead 133 of counter 103 and is supplied to the input 140 of XOR gate 124, then the output of XOR gate 124, shown in Column I of FIG. 5, will have a value of binary 1 for the first 4 output counts of counter 105 since the value on output lead 127 of adder 104 is a binary 1 for the first 4 counts of an 8-count cycle of 3-stage counter 105. During the second 4 counts of the 8-count cycle of counter 105, the output of XOR gate 124 is a binary 0 since the signals supplied to the 2 inputs thereof are both high, e.g., a binary 1. The binary value of the outputs of the 2 XOR gates 125 and 126 are the same as shown in the truth table of FIG. 5 and correspond to the decimal values in Column IV of FIG. 5.

A comparison of the waveforms of FIGS. 4 and 6, both of which have the same x-axis time scale relative to the beginning of the count of counter 105 of FIG. 1, reveals that the waveform of FIG. 5 is phase shifted to the left of the waveform of FIG. 4. This shift in phase is due to a binary 1 appearing on lead 133 of counter 103 and is supplied to one input of XOR gate 124, as discussed above. Such binary 1 represents the phase shift of the waveform of FIG. 6 with respect to that of FIG. 4 of 360°/8 or 45°. It is to be noted, however, that output lead 133 of 18-bit counter 103 is the 27th bit position of the total 30 bit positions including both 12-bit accumulator 101 and 18-bit counter 103. Therefore, the 45° phase shift represented by a binary 1 appearing on output lead 133 of counter 103 required $2^{27}$ cycles of the 1.024 KHz output from oscillator 100. Since the incremental binary values are continuously being supplied to accumulator 101, the change in phase becomes a rate of change in phase or frequency.

By supplying bits from lower order bit positions of 18-bit counter 103 directly to XOR gates 119 through 124, the phase of the output signal from the D/A converter 106 can be changed in increasingly finer increments. Further, by increasing the number of positions in the D/A 106 to a larger number, the phase quantizing can be made finer. For example, if D/A converter 106 were to have 12 bit positions, the phase quantizing steps would be $360°/2^{12}$.

It is to be noted that the supplying of binary signals from counter 103 directly to XOR gates 119 to 124 can change the phase of the signal generated at the output of D/A converter 106 only up to 45°. To change such phase by 45° or more it is necessary to supply binary signals directly to adder 104 which are then added to the binary values supplied to adder 104 from counter 105. The foregoing is accomplished by the 3 leads 141 which function to supply the 3 most significant bits of counter 103 to adder 104 where they are added to the value supplied from the outputs 120 of adder 105. A binary 1 in the most significant bit position of counter 103 will shift the phase of the signal supplied to adder 104 from 3-stage counter 105 by 180°. A binary 1 in the next most significant bit position of counter 103 will shift the phase of the signal supplied from counter 105 by 90°, and a binary 1 on the third most significannt bit position of counter 103 will shift the phase of the signal from 3-stage counter 105 by 45°.

Referring now to FIG. 2, there is shown another form of the invention similar to that shown in FIG. 1 but with a 4-stage counter 205 and a 3-bit adder 104 instead of the 3-bit counter 105 and 3-bit adder 104 of FIG. 1. Elements of FIG. 2 which correspond to elements of FIG. 1 are identified by the same reference character.

Since a 4-stage counter 205 is employed in FIG. 2, the nominal center frequency will be $1.024 \text{ MHz}/\text{MHz}/2^{16}$ which is equal to 64 KHz. A 4-stage counter 205 requires a 4-stage adder 204. To accommodate the 4-stage adder 204 the 4 most significant bit positions of counter 103 are connected to the 4 most significant bit positions of 4-bit adder 204 by leads 130–133. The 4-bit adder 204 will have a fourth output 150 which is connected to one input of XOR gate 124.

A rate multiplier can be substituted for the accumulator of FIGS. 1 and 2. The advantages of a rate multiplier over an accumulator are largely economic. They are considerably less expensive than an accumulator since they do not require the relatively complex parallel adder which is employed in an accumulator.

Figure 7:
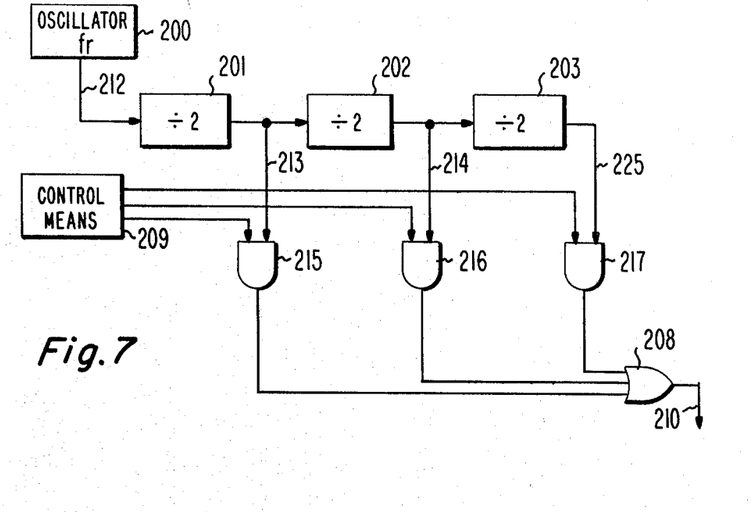
FIG. 7 shows yet another embodiment of the invention.

A rate multiplier suitable for use in the structures of FIGS. 1 and 2, in lieu of the arithmetic synthesizer, is shown in FIG. 7. The rate multiplier includes an oscillator 200 of frequency $f_r$ which, as in the structure of FIGS. 1 and 2, is 1.024 MHz. The output of oscillator 200 is supplied to the first stage 201 of a series of divide by 2 dividers. While only 3 of such dividers 201, 202 and 203 are shown in FIG. 7, it is to be understood that 12 such stages are required to perform the function of the 12-bit accumulator 101 of FIGS. 1 and 2. The output of oscillator 200 and the outputs of each of divider stages 201, 202 and 203 are supplied respectively through AND gates 205–207 to a common OR gate 208. The AND gates 215–217 are under control of control means 209 which can selectively prime any combination of said AND gates 215–217.

Figure 8:
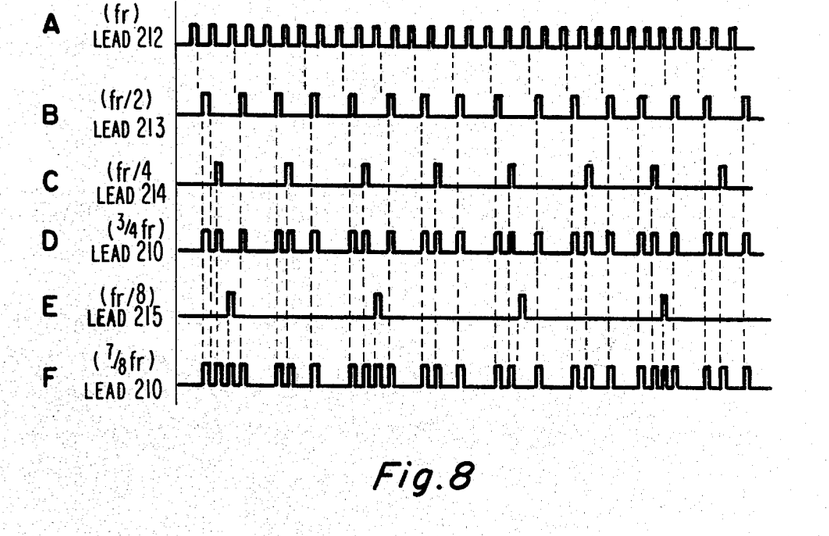
FIG. 8 is a set of waveforms illustrating the operation of FIG. 7.

For purposes of convenience, the 6 waveforms of FIG. 8 will be identified as waveforms 8A, 8B . . . 8F, rather than as waveform A of FIG. 8, for example.

The output of the first divide by 2 stage 201 is shown in waveform 8B and produces a series of pulses at a rate $f_r/2$. If only AND gate 215 is primed by control means 209, the output of OR gate 208 will be a train of pulses as shown in waveform 8B having said repetition rate $f_r/2$. The output of the second divide by 2 stage 202 is shown in waveform 8C and consists of a train of pulses occurring at a rate $f_r/4$.

If only AND gate 216 is primed, the train of pulses shown by waveform 8C will be supplied through AND gate 216 and OR gate 208. If both AND gates 215 and 216 are primed by control means 209 then the outputs of both divider stages 201 and 202 will be supplied through AND gates 215 and 216 to OR gate 208. The combination of such 2 trains of pulses is shown in waveform 8D and consists of a series of pulses occurring at a rate $\frac{3}{4} f_r$.

The output of the third divide by 2 stage 203 is a train of pulses occurring at a rate $f_r/8$ as shown in waveform 8E and which will be supplied to OR gate 208 when AND gate 217 is primed by control means 209. If all three AND gates 215, 216, and 217 are primed by control means 209, then the 3 trains of pulses from divide by 2 stages 201, 202 and 203 will all be supplied through OR gate means 208 to output terminal 210. Such combined train of pulses is shown in waveform 8F and have a repetition rate equal to $\frac{7}{8} f_r$. Further, any combination of AND gates 215–217 can be primed to supply trains of pulses having intermediate repetition rates to OR gate 208. For example, if AND gates 215 and 217 are both primed, the trains of pulses represented by waveform 8B and 8E will be supplied to OR gate 208. The resulting combined train of pulses appearing on output lead 210 of OR gate 208 will have a repetition rate of $\frac{5}{8} f_r$.

What is claimed is:

1. A system for selectively generating any one of M signals frequency spaced apart of S Hz where S is a fixed value, and comprising:
   first means for generating a first signal of frequency $f_c$;
   second means responsive to said first signal to produce a first binary output signal of frequency $Nf_c/2^n$, where N is a variable integer and n is an integer;
   first frequency divider means responsive to said first output signal to produce a second binary output signal of frequency $Nf_c/2^{n+m}$, where $f_c/2^{n+m}=S$ and m is an integer;
   second frequency divider means responsive to said first signal to produce a third binary output signal of frequency $f_c/d$, where d is an integer $<n+m$; and
   logic means responsive to said second and third binary output signal to produce a fourth output signal of average frequency $f_c/d+Nf_c/2^{n+m}$.

2. A system as in claim 1 in which said second means comprises an accumulator.

3. A system as in claim 1 in which said second means comprises a rate multiplier.

4. A system for selectively generating any one of M signals frequency spaced apart by S Hz where S is a fixed value, and comprising:
   first means for generating a first signal of frequency $f_c$;
   second means responsive to said first signal to produce a first binary output signal of frequency $Nf_c/2^n$
   where N is a variable integer and n is an integer;
   m stage binary counter means having an output terminal for the R most significant stages thereof and responsive to said first binary output signal to produce a second binary output signal of frequency $Nf_c/2^{n+m}$, where $f_c/2^{n+m}=S$ and m is an integer;
   T stage binary counter means having an output terminals for each stage thereof and responsive to said first signal to produce a third binary output signal of frequency $f_c/2^T$; and
   logic means responsive to said third binary output signal and to the binary signals appearing on the output terminals of the R most significant binary stages of said m stage binary counter means to produce a resultant output signal of average frequency $f_c/2^T+Nf_c/2^{n+m}$.

5. A system as in claim 4 in which said logic means comprises:
   a T stage adder responsive to said third binary output signal and the contents of the Tth most significant bit positions of said m stage binary counter means to produce a fourth binary output signal of frequency $f_c/2^T+Nf_c/2^{n+m}$;
   a first plurality of XOR gates each having first and second input terminals and an output terminal;
   means for supplying the contents of the most significant bit position of said T stage adder to the first input terminals of all of said first plurality of XOR gates; and
   means for supplying the contents of descending orders of bit positions of said T stage adder, beginning with the next most significant bit position thereof, to the second input terminal of successive ones of said first plurality of XOR gates.

6. A system as in claim 5 in which said logic means further comprises:
   a second plurality of XOR gates each having first and second input termminals and an output terminal;
   means for supplying the contents of the most significant bit position of said T stage adder to the first input terminal of all of said second plurality of XOR gates;
   means for supplying the contents of descending orders of bit positions of said m stage counter means, beginning with said Rth stage, to the second input terminals of successive ones of said second plurality of XOR gates; and
   third means responsive to the output of said first and second plurality of XOR gates to produce said resultant output signal.

7. A system as in claim 4 in which said second means comprises an accumulator.

8. A system as in claim 4 in which said second means comprises a rate multiplier.

9. A system for selectively generating M signals frequency spaced apart by S Hz where S is a fixed value and comprising:
   first means for generating a first signal of frequency $f_c$;
   second means responsive to said first signal to produce a first output signal of frequency $Nf_c/2^n$, where N is a variable integer and n is an integer;
   m stage binary counter means having an output terminal for the R most significant stages and responsive to said first output signal to produce a second output signal of frequency $Nf_c/2^{n+m}=S$ and m is an integer;
   T stage binary counter means for dividing said first signal by a factor $2^T$ and having an output terminal for each stage thereof;
   T stage adder means responsive to the signals appearing on the output terminals of said T stage counter means and to the signals appearing on the output terminals of stages included in the R most significant stages of said m stage binary counter means to produce a digitized output signal of average frequency $f_c/2^T + Nf_c/2^{n+m}$; and logic means comprising digital-to-analog converting means responsive to the output signal from said T stage adder means and to the output signals appearing on the $R^{th}$ to the $Y^{th}$ output terminals of said m stage binary counter means to produce an analog signal of average frequency $f_c/2^T + Nf_c/2^{n+m}$, whereby $Y \leq m$.

10. A system as in claim 9 in which said logic means comprises:

a plurality of XOR gates each having first and second input terminals and an output terminal;

means for supplying the contents of the most significant bit position of said T stage adder means the first input terminal of all of said XOR gates;

means for supplying the contents of descending orders of bit positions of said T stage adder means, beginning with the next most significant bit position, to the second input terminals of successive ones of the next $T-1$ XOR gates;

means for supplying the contents of descending orders of bit positions of said m stage counter means, beginning with the $R^{th}$ most significant bit position, to the second input terminals of successive ones of said plurality of XOR gates, beginning with the $(R-1)^{th}$ XOR gate; and in which said digital-to-analog converting means is responsive to the outputs of said plurality of XOR gates to produce said analog signal.

* * * * *

UNITED STATES PATENT AND TRADEMARK OFFICE
CERTIFICATE OF CORRECTION

PATENT NO. : 4,349,887
DATED : September 14, 1982
INVENTOR(S): Albert Timothy Crowley It is certified that error appears in the above-identified patent and that said Letters Patent is hereby corrected as shown below:

Column 3, line 32, "durng" should be --during--;

Column 4, line 9, "online" should be --on line---;

Column 9, line 34, "of" should be --by--.

Signed and Sealed this

Twenty-second Day of February 1983

|SEAL|

Attest:

GERALD J. MOSSINGHOFF

Attesting Officer     Commissioner of Patents and Trademarks